(12) United States Patent
Marques et al.

(10) Patent No.: US 11,899,433 B2
(45) Date of Patent: Feb. 13, 2024

(54) MULTIDROP MAKE AND BREAK SYSTEM

(71) Applicant: Rockwell Automation Technologies, Inc., Mayfield Heights, OH (US)

(72) Inventors: Roberto S. Marques, Cedarburg, WI (US); Yutao Wang, Brookfield, WI (US); William H. Martin, Milwaukee, WI (US); Chirag L. Malkan, Brookfield, WI (US); Mason Khan, Milwaukee, WI (US); Steven T. Haensgen, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 205 days.

(21) Appl. No.: 17/449,479

(22) Filed: Sep. 30, 2021

(65) Prior Publication Data

US 2023/0098504 A1  Mar. 30, 2023

(51) Int. Cl.
*G05B 19/418* (2006.01)
*H04L 12/10* (2006.01)

(52) U.S. Cl.
CPC ... *G05B 19/4185* (2013.01); *G05B 19/41885* (2013.01); *H04L 12/10* (2013.01)

(58) Field of Classification Search
CPC .......... G05B 19/4185; G05B 19/41885; H04L 12/10
See application file for complete search history.

(56) References Cited

U.S. PATENT DOCUMENTS

| | | | |
|---|---|---|---|
| 7,260,200 B1 * | 8/2007 | Reynolds | H04L 69/40 379/207.02 |
| 2007/0025240 A1 * | 2/2007 | Snide | H04L 12/40169 370/217 |
| 2011/0145433 A1 * | 6/2011 | Noel | H04L 12/437 709/232 |
| 2013/0049728 A1 * | 2/2013 | Fender | H02J 3/1828 323/311 |
| 2020/0344906 A1 | 10/2020 | Frye | |

FOREIGN PATENT DOCUMENTS

| | | |
|---|---|---|
| EP | 2544058 A1 | 4/2016 |
| EP | 3562283 A1 | 10/2019 |

OTHER PUBLICATIONS

European Patent Office, "Communication pursuant to Rule 62 EPC, Extended European Search Report", application No. 22196589.0 EPO, dated Feb. 3, 2023, 12 pages.

* cited by examiner

*Primary Examiner* — Gary Collins
(74) *Attorney, Agent, or Firm* — Fletcher Yoder, P.C.

(57) ABSTRACT

A multidrop system configured to be installed within a motor control center (MCC) of an industrial automation system includes a trunkline. The trunkline includes multiple multidrop make and break devices connected through a trunkline cable. Each of the multidrop make and break device includes a first network component, and a second network component. The first network component is configured to form a first subnet over the trunkline. The second network component is configured to couple a MCC withdrawable unit and form a second subnet over a branchline that connects one or more nodes within the MCC withdrawable unit. The multidrop make and break device is configured to couple the MCC withdrawable unit to, and decouple the MCC withdrawable unit from, the second network component without disrupting the first subnet.

20 Claims, 8 Drawing Sheets

MULTIDROP MAKE AND BREAK SYSTEM

BACKGROUND

The present disclosure relates generally to motor control centers (MCCs) for industrial automation systems. More specifically, the present disclosure relates to multidrop make and break system for connecting and disconnecting withdrawable MCC units to an MCC of an industrial automation system.

Industrial automation systems may be used to provide automated control of one or more actuators. A controller may output a conditioned power signal to an actuator to control movement of the actuator. Multiple controllers of an industrial automation system may be grouped together, along with other components, and housed in an enclosure to form an MCC. MCCs are divided into vertical sections, with each section further divided into one or more buckets. The buckets are configured to receive units (e.g., pieces of industrial automation equipment). The various components and/or units of an MCC, and the components within those units, may communicate with one another via a wired network or subnet. For example, a multidrop cable may be run through an enclosure of the MCC and be communicatively coupled to the units within the MCC, and/or the components within a unit. If a unit of the MCC is inserted or removed over too long a period of time, inserting or removing the unit may disturb the network and/or subnet. Accordingly, there is a need for a way to insert and remove units from an MCC without disturbing the network and/or subnet.

BRIEF DESCRIPTION

In one embodiment, a multidrop system is configured to be installed within a motor control center (MCC) of an industrial automation system. The multidrop system includes a trunkline that includes multiple multidrop make and break devices connected through a trunkline cable. Each of the multidrop make and break device includes a trunk network component, and a sub-network component. The trunk network component is configured to form a multidrop network comprising multiple MCC units over the trunkline. The sub-network component is configured to couple a MCC withdrawable unit and form an independent sub-network over a branchline that connects one or more nodes within the MCC withdrawable unit. The multidrop make and break device is configured to couple the MCC withdrawable unit to, and decouple the MCC withdrawable unit from, the sub-network component without disrupting the multidrop network.

In another embodiment, an apparatus for providing a trunk subnet and one or more branch subnets within a motor control center (MCC) of an industrial automation system includes a first network component configured to form the trunk subnet over a trunkline and a second network component configured to: couple a MCC withdrawable unit and form a branch subnet over a branchline that connects one or more nodes within the MCC withdrawable unit; and decouple the MCC withdrawable unit from the branch subnet without disrupting the trunk subnet.

In yet another embodiment, a system includes a motor control center (MCC) and a multidrop system. The multidrop system includes a trunkline comprising multiple multidrop make and break devices connected through a trunkline cable, each of the multidrop make and break device comprises: a first network component configured to form a first subnet over the trunkline; and a second network component configured to couple a MCC withdrawable unit installed in the bucket of the MCC and form a second subnet over a branchline that connects one or more nodes within the MCC withdrawable unit, wherein the multidrop make and break device is configured to couple the MCC withdrawable unit to, and decouple the MCC withdrawable unit from, the second network component without disrupting the first subnet.

DRAWINGS

These and other features, aspects, and advantages of the present embodiments will become better understood when the following detailed description is read with reference to the accompanying drawings in which like characters represent like parts throughout the drawings, wherein.

DETAILED DESCRIPTION

Figure 1:
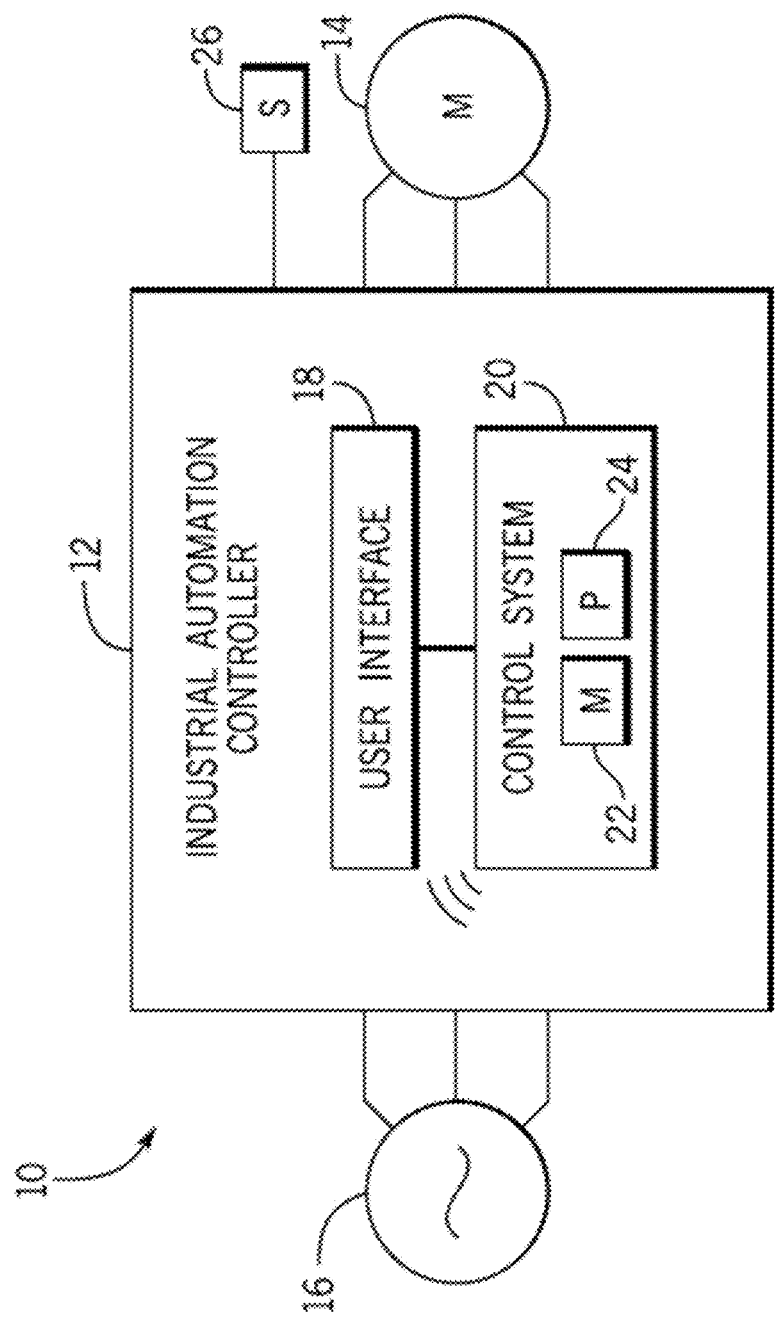
FIG. 1 is a schematic view of an industrial automation system, in accordance with embodiments presented herein.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

An industrial automation system may utilize a controller to output a conditioned power signal to one or more actuators to control movement of the actuators. The controller may be combined with other components in a housing or enclosure to form a motor control center (MCC) that controls the movement of multiple actuators. An enclosure of an MCC may be divided into one or more vertical sections, with each section further divided into one or more buckets that are configured to receive units (e.g., variable frequency drives (VFDs), programmable logic controllers (PLCs), programmable automation controllers (PACs), contactors, starters, overload protection components, fuses, circuit breakers, disconnects, short circuit protectors, etc.). A multidrop cable may be routed through an enclosure of the MCC and be communicatively coupled to the units within the MCC, and in some cases, components within the units, to establish a subnet or a network that is part of another network for the MCC. A subnet is a multidrop network. If a unit of the MCC is inserted or removed over too long a period of time, inserting or removing the unit may disturb the network and/or subnet.

The disclosed techniques include a multidrop make and break device for coupling to a withdrawable MCC unit to a multidrop cable. Specifically, the multidrop cable may serve as a trunk line and may include conductors that form a single pair Ethernet (SPE) pair that facilitate communication of data between components of the subnet, a switched power (SP) pair that provide power to one or more actuation components of a device within the subnet, a network power (NP) pair that provide power network components of the device within the subnet, and a select line that manages communication via the SPE pair. The multidrop make and break device includes a first network module configured to provide the trunk line network (e.g., primary network) connection and a second network module configured to provide a branch line sub-network (e.g., secondary network) connection for a withdrawable unit such that addition or removal of the withdrawable unit on the network does not interrupt the trunk line network connection. The branch line sub-network allows peer-to-peer communication between nodes within the sub-network and allows the nodes to receive commands from the trunk line network. The multidrop make and break device enables the addition of multiple nodes, within the MCC withdrawable unit, to the subnet to which various components (e.g., variable frequency drives (VFDs), programmable logic controllers (PLCs), programmable automation controllers (PACs), contactors, starters, overload protection components, fuses, circuit breakers, disconnects, short circuit protectors, etc.) may connect. Further, the multidrop make and break device enables withdrawable MCC units to be coupled to a decoupled from the multidrop cable in a way that does not disturb the network or subnet within the MCC. In some embodiments, the multidrop make and break device may be applied to any multidrop network types, such as CAN, LIN, RS-485, single pair Ethernet, etc.

By way of introduction, FIG. 1 is a schematic view of an example industrial automation system 10 in which the embodiments described herein may be implemented. As shown, the industrial automation system 10 includes a controller 12 and an actuator 14 (e.g., a motor). The industrial automation system 10 may also include, or be coupled to, a power source 16. The power source 16 may include a generator, a battery (or other power storage device), or an external power grid. Though the controller 12 shown in FIG. 1 is a stand-alone controller 12, in more complex industrial automation systems 10, one or more controllers 12 may be grouped together with other components in a motor control center (MCC, shown and described below with regard to FIG. 2) to control multiple actuators. In the instant embodiment, the controller 12 includes a user interface 18, such as a human machine interface (HMI), and a control system 20, which may include a memory 22 and a processor 24. The controller 12 may include a cabinet or some other enclosure for housing various components of the industrial automation system 10, such as a motor starter, a disconnect switch, etc.

The control system 20 may be programmed (e.g., via computer readable code or instructions stored on the memory 22 and configured to be executed by the processor 24) to provide signals for driving the motor 14. In certain embodiments, the control system 20 may be programmed according to a specific configuration desired for a particular application. For example, the control system 20 may be programmed to respond to external inputs, such as reference signals, alarms, command/status signals, etc. The external inputs may originate from one or more relays or other electronic devices. The programming of the control system 20 may be accomplished through software configuration or firmware code that may be loaded onto the internal memory 22 of the control system 20 or programmed via the user interface 18 of the controller 12. The control system 20 may respond to a defined set of operating parameters. The settings of the various operating parameters determine the operating characteristics of the controller 12. For example, various operating parameters may determine the speed or torque of the motor 14 or may determine how the controller 12 responds to the various external inputs. As such, the operating parameters may be used to map control variables within the controller 12 or to control other devices communicatively coupled to the controller 12. These variables may include, for example, speed presets, feedback types and values, computational gains and variables, algorithm adjustments, status and feedback variables, programmable logic controller (PLC) like control programming, and the like.

In some embodiments, the controller 12 may be communicatively coupled to one or more sensors 26 for detecting operating temperatures, voltages, currents, pressures, flow rates, etc. within the industrial automation system 10. With feedback data from the sensors, the control system 20 may keep detailed track of the various conditions under which the industrial automation system 10 may be operating. For example, the feedback data may include conditions such as actual motor speed, voltage, frequency, power quality, alarm conditions, etc.

Figure 2:
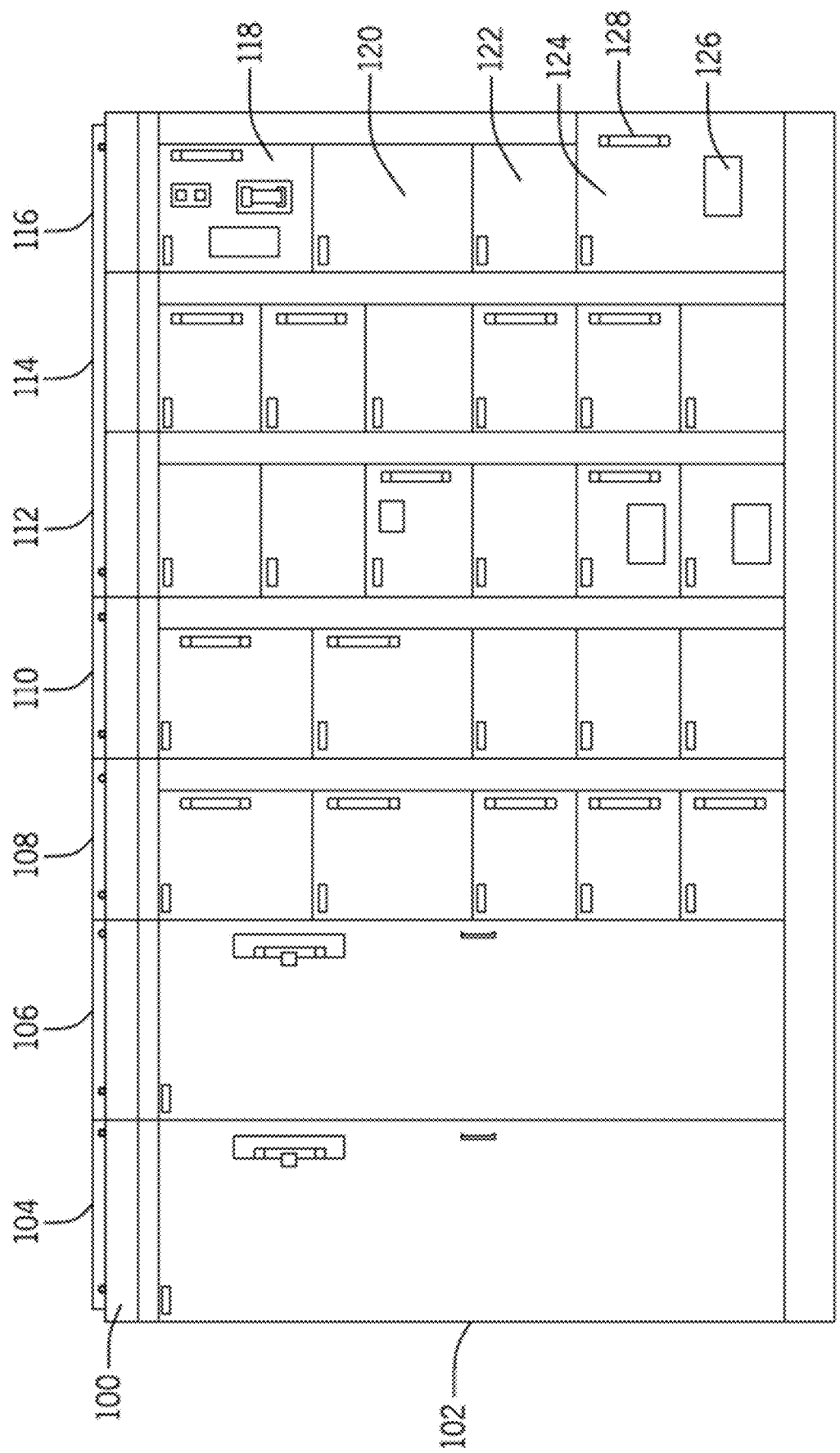
FIG. 2 is a front view of an embodiment of an MCC, in accordance with embodiments presented herein.

As mentioned above, in some complex industrial automation systems 10, one or more controllers and/or other industrial automation components (e.g., variable frequency drives (VFDs), PLCs, programmable automation controllers (PACs), contactors, starters, overload protection components, fuses, circuit breakers, disconnects, short circuit protectors, etc.) may be combined into an enclosure or cabinet and referred to as an MCC. FIG. 2 is a front view of an embodiment of an MCC 100. As shown, the MCC 100 includes an enclosure 102 that is divided into vertical sections 104, 106, 108, 110, 112, 114, 116. Each section may be further divided into one or more buckets 118, 120, 122, 124, which may be configured to receive units. The units may include, industrial automation components configured to perform industrial automation functions. The units may thus include, for example, motor controllers, VFDs, PLCs, PACs, contactors, starters, overload protection components, fuses, circuit breakers, disconnects, short circuit protectors, and so forth. In some embodiments, the size of each bucket 118, 120, 122, 124 may be customized to the type of unit the bucket 118, 120, 122, 124 is configured to receive. In other embodiments, different MCCs 100 may be available preconfigured with differently sized buckets. As shown, the cabinet doors 126 of some buckets may include disconnect switches 128 for disconnecting the respective unit from the MCC 100. Accordingly, to remove a unit, a user may actuate the disconnect switch 128 (e.g., from "on" to "off") to electrically disconnect the unit from the MCC 100. The user may then open the cabinet door 126, and physically remove the unit from the enclosure 102. If the unit is being replaced with a different unit, the new unit may be physically installed in the bucket 124, the cabinet door 126 closed, and the disconnect switch 128 actuated (e.g., from "off" to "on").

Figure 3:
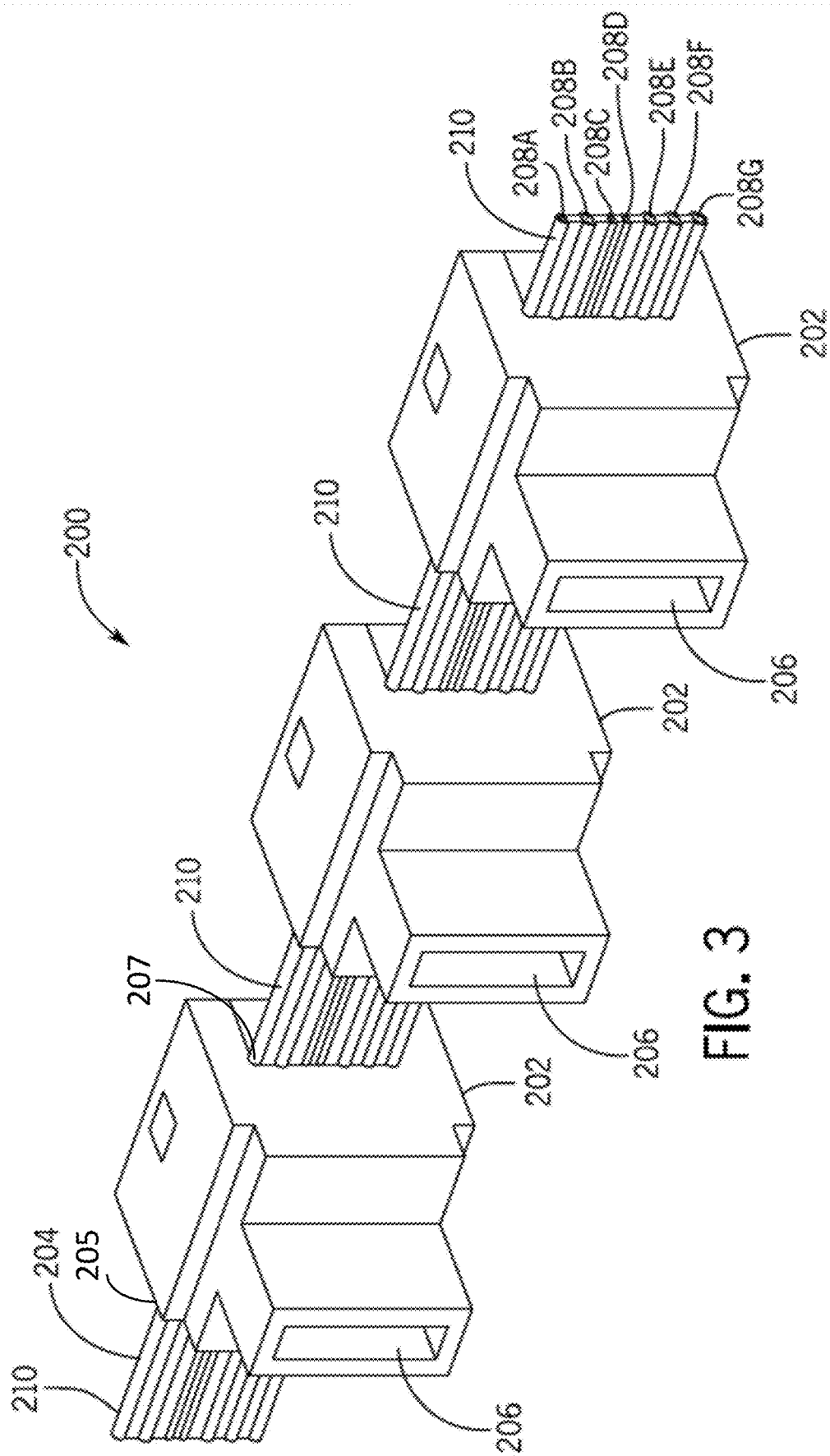
FIG. 3 is a perspective view of a portion of a multidrop cable used in the MCC of FIG. 2, in accordance with embodiments presented herein.

The units within an MCC 100 may join a wired subnet by coupling to one or more multidrop cables that extend through the MCC enclosure 102. In some embodiments, one or more multidrop cables may also extend within a unit, communicatively coupling components within the unit. FIG. 3 depicts a portion of the multidrop cable 200 for use within the MCC 100 of FIG. 2. The illustrated portion of the multidrop cable 200 may include one or more multidrop make and break devices 202 positioned along transmission lines 204. Each multidrop make and break device 202 may include a first terminal 205, a second terminal 207, and a third terminal 206. The first terminal 205 and the second terminal 207 connects to the transmission line 204. The third terminal 206 is configured for receiving a MCC withdrawable unit including one or more industrial devices (not shown). In some embodiments, the multidrop make and break device 202 has a T-shape. In some embodiments, the multidrop make and break device 202 may include a connector component and a make and break component. The connector component includes the first and second terminals connecting to the transmission line 204. The make and break component includes the third terminal for receiving a MCC withdrawable unit. The make and break component may be removably coupled to the connector component. In some embodiments, the third terminal 206 of multidrop make and break devices 202 may be referred to as "drops", while the portions of transmission lines 204 extending between the first terminal 205 and the second terminal 207 may be referred to as "trunks" 210. Accordingly, the term "multidrop" in multidrop cable 200 refers to the cable 200 having multiple multidrop make and break devices 202 to which components may be connected. In some embodiments, the multidrop make and break devices 202 may enable multiple nodes to be added to the multidrop cable 200 at a single drop (e.g., a plurality of nodes may be coupled to a cable, in a single line, that couples to the multidrop cable 200 at one multidrop make and break device 202). In some embodiments, the multidrop cable 200 may include long trunks 210 between drops 202, or may include no drops 202 at all, such that new drops 202 can be added as needed. The multidrop make and break devices 202 are configured to enable communication through the trunk 210 and generate another subnet as a "branch" line for connecting and disconnecting MCC withdrawable units without disturbing the network or subnet of the MCC. The transmission lines 204 may include electrical conductors 208A-208G. It should be noted that different number of multidrop make and break devices 202 may be used in different embodiments with the multidrop cable 200 in the MCC 100.

The multidrop cable 200 may facilitate communication between the nodes using various communication protocols. Hence, the number of conductors of transmission lines 204 and the arrangement of the conductors may vary based on the communication protocol being used by the MCC 100. For example, the multidrop cable 200 may use an industrial Ethernet network protocol (EtherNet/IP). The multidrop make and break devices 202 may each include respective tap circuitry that may facilitate connection of various industrial automation components to the transmission lines 204 of the multidrop cable 200. The multidrop make and break devices may facilitate power transmission and/or communication between the input/output signals of the respective node and the transmission lines 204 of the multidrop cable 200.

The MCC 100 may facilitate data communication between different numbers of nodes in different configurations and different directions using the multidrop cable 200. For example, the MCC 100 may communicatively connect motor controllers, VFDs, PLCs, PACs, contactors, starters, overload protection components, fuses, circuit breakers, disconnects, short circuit protectors, etc. within the MCC 100 using one or multiple multidrop cables 200. Also, a node may take any shape or form as long as the connections adhere to the communication protocol of the multidrop cable 200. For example, a sensor 26 (shown in FIG. 1) may be positioned on a tap circuitry, and the tap circuitry may connect to a slot 206 of the multidrop make and break devices 202 to communicate with one or multiple other nodes connected on the multidrop cable 200 through the transmission lines 204.

Figure 4:
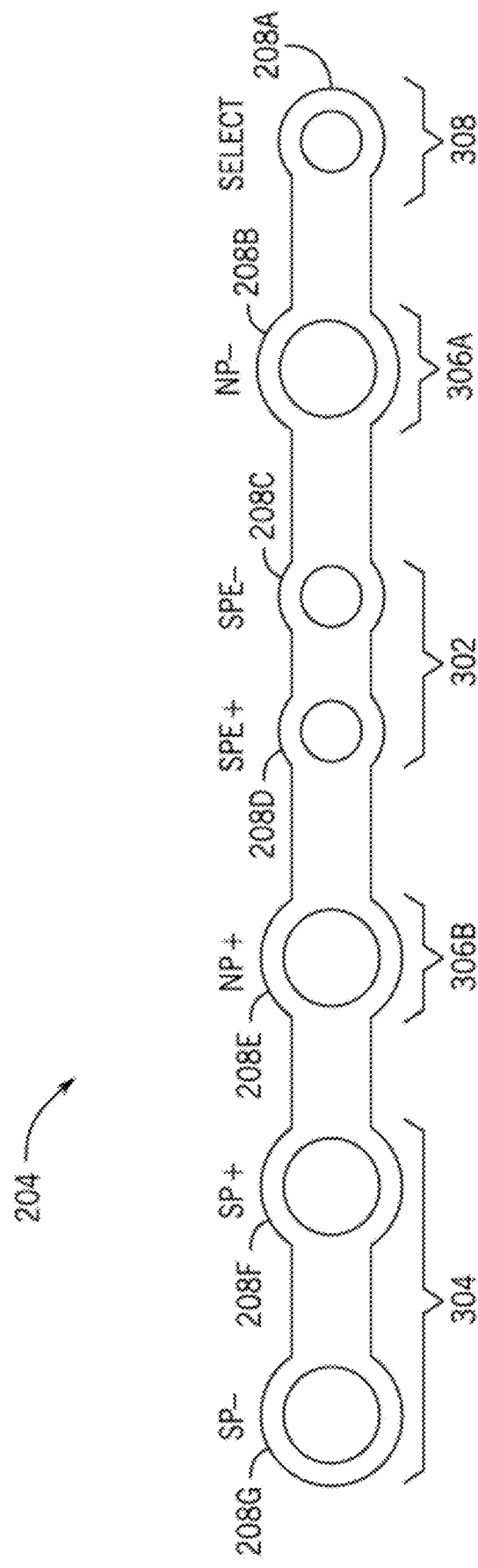
FIG. 4 is a cross-sectional view of the portion of a multidrop cable shown in FIG. 3, in accordance with embodiments presented herein.

FIG. 4 depicts a cross-sectional side view of an embodiment of the transmission lines 204 of the multidrop cable 200 using EtherNet/IP protocol. It should be noted that the multidrop cable 200 is not intended to be limited to the EtherNet/IP protocol or the depicted conductors 208A-208G shown in FIG. 4. The multidrop cable 200 may employ other communication protocols and/or other combination of conductors in different embodiments. Also, the transmission lines 204 may include cables with different wire gauge or conductive materials for different applications.

The transmission lines 204 may include single pair Ethernet (SPE) conductors 302, a switched power (SP) 304 pair, a pair of network power (NP) conductors 306A and 306B, and a select line conductor 308. The SPE 302 may include a first and a second conductor to enable transmission of a differential signal. In certain embodiments, the SPE 302 may be a single pair Ethernet cable and the SP 304 and the NP 306A and 306B may carry Direct Current (DC) power. The SPE 302 conductors may transmit communication signals and the SP 304 conductors may transmit signals in the form of switched electrical power between different nodes. In some embodiments, the SPE 302 and/or the SP 304 may deliver electrical power to one or multiple nodes to power actuators, contactors, and sounders, among other things. The NP 306A and NP 306B conductors may provide electrical power to one or multiple nodes. In some embodiments, the NP 306A and NP 306B conductors may power the communication circuits and/or microcontrollers of the respective one or multiple nodes. Furthermore, the select line conductor 308 may communicate a select line signal to facilitate identification and configuration of nodes. The select line conductor 308 may transmit communication signals and/or facilitate communication or transmission of power signals by the SPE 302 conductors and/or the SP 304 conductors. For example, the select line conductor 308 may include identification numbers associated with selection of a node on the multidrop cable 200. It should be noted that in different examples a selected node by the select line conductor 308 may perform different functions associated with the selected node.

Figure 5:
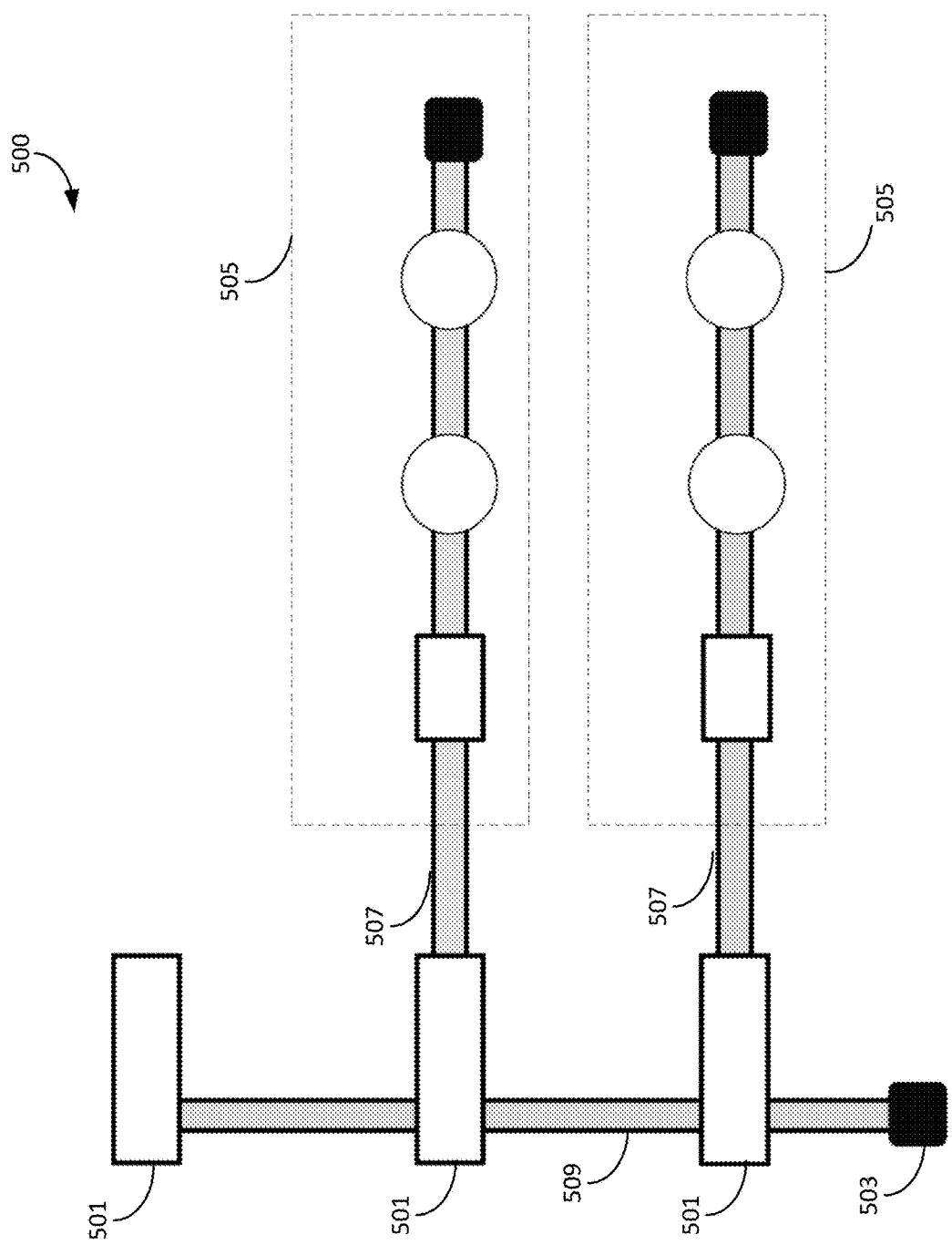
FIG. 5 is a block diagram of a multidrop make and break system with a subnet trunk and drop topology, in accordance with embodiments presented herein.

FIG. 5 is a block diagram of a multidrop make and break system 500 with a subnet trunk and drop topology according to an illustrative embodiment. The multidrop make and break system 500 includes multiple multidrop make and break devices 501 connected in series by a network cable to form a subnet trunkline 509. The subnet trunkline 509 may include a terminator 503. Each multidrop make and break device 501 is configured to enable communication through the subnet trunkline 509 and create another subnet through a subnet branchline 507. The subnet branchline 507 enables a withdrawable unit 505 to connect or disconnect to/from the multidrop make and break device 501 without disturbing communications over the subnet trunkline 509. The withdrawable unit 505 can include one or more nodes that can communicate with each other over the branch subnet 507 and communicate with other unit or equipment in the multidrop make and break system 500 through the combination of branch subnet 507 and the trunk subnet 509.

Figure 6:
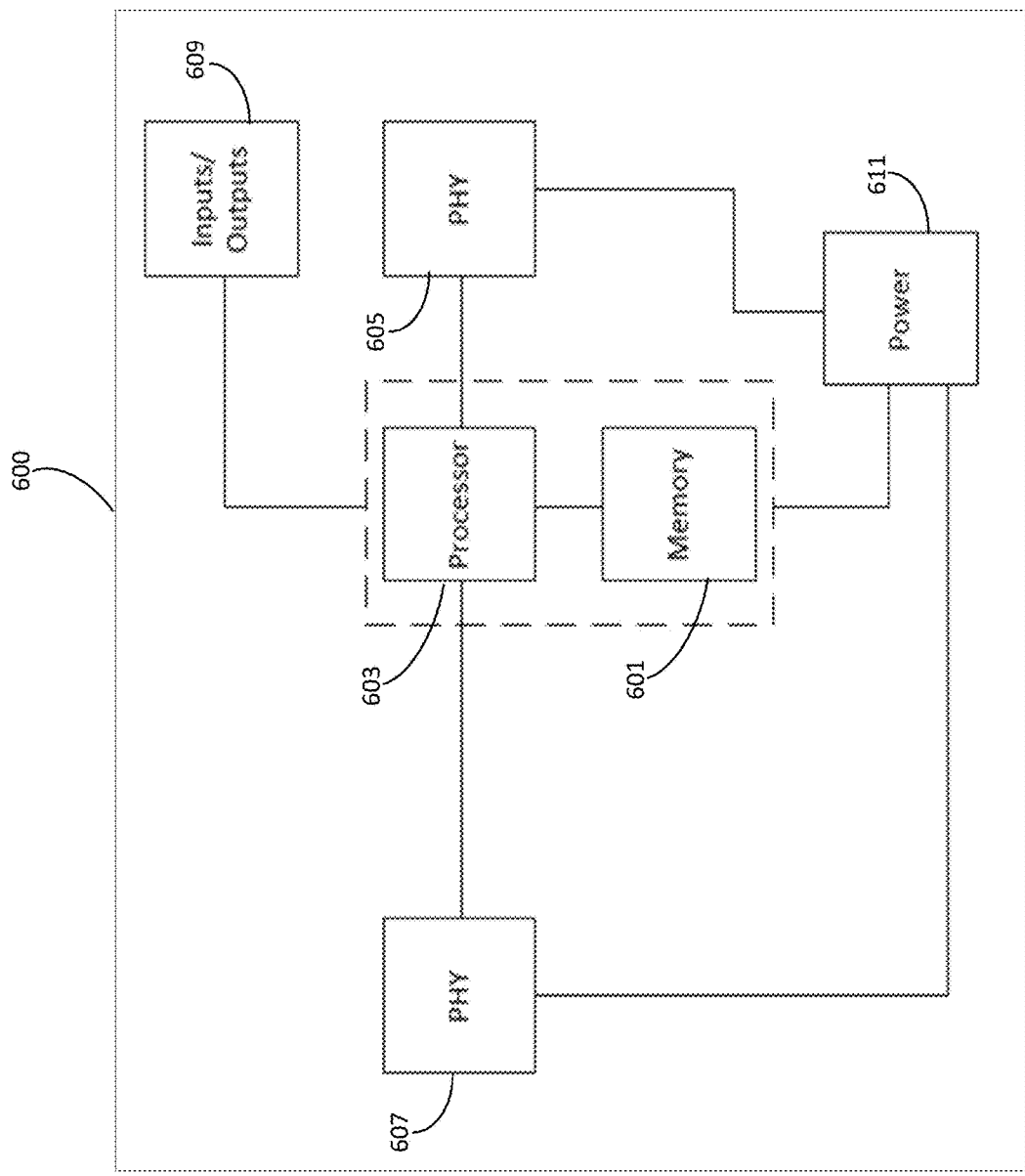
FIG. 6 is block diagram of a multidrop make and break device, in accordance with embodiments presented herein.

FIG. 6 is block diagram of a multidrop make and break device 600 according to an illustrative embodiment. The multidrop make and break device 600 include a memory 601, a processor 603, an input/output component 609, a first network component 607, and a second network component 605. In various embodiments, one or more of the memory 601, the processor 603, the input/output component 609, the first network component 607, and the second network component 605 can be electrically and/or communicatively coupled to one another to perform one or more of the functions of the multidrop make and break device 600. In some embodiments, the components 609, 607, and 605 can comprise software/firmware instructions stored on memory 601 and executed by processor 603.

The input/output component 609 may include three terminal components. A first and a second terminal components are connected to a subnet trunkline cable and configured to transmit communication signals over a trunk subnet. A third terminal component is configured to be connected to a withdrawable unit and transmit communication signals over a branch subnet.

The first network component 607 includes a first physical layer (PHY) circuitry configured to form a trunk subnet and enable communication through the trunk subnet. The second network component 609 includes a second PHY circuitry configured to form a branch subnet and enable communication through the branch subnet.

Figure 7:
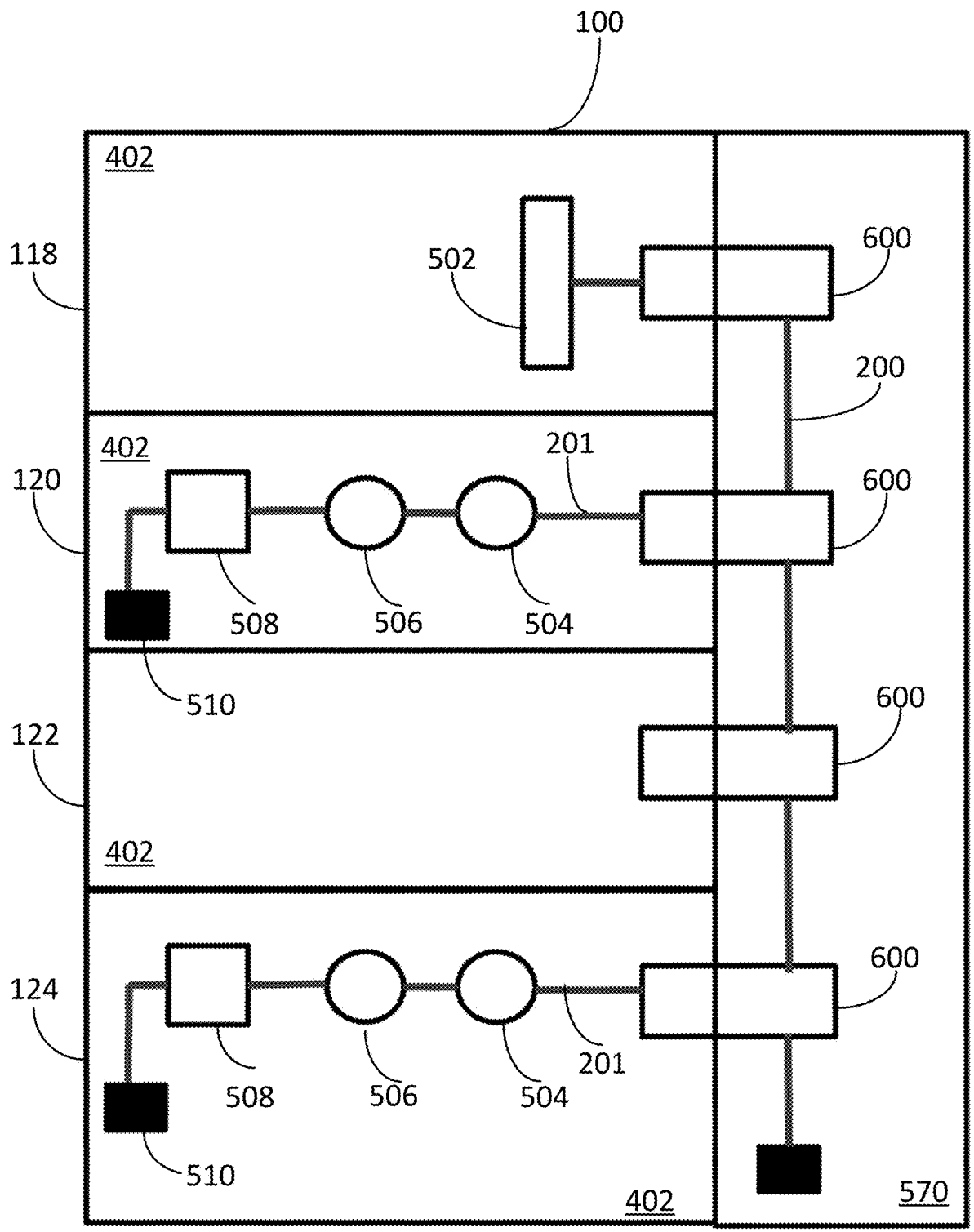
FIG. 7 is a schematic view of the MCC in which one of the buckets is connected to the multidrop cable via the multidrop make and break device, in accordance with embodiments presented herein.

FIG. 7 illustrates a schematic view of an MCC 100 in which MCC withdrawable units 402 installed in buckets are connected to the multidrop cable 200 via multidrop make and break devices 600. As shown, the MCC 100 includes buckets 118, 120, 122, 124, which house MCC withdrawable units 402. Buckets 118, 120, 122, and 124 are connected to the subnet via multidrop make and break devices 600 of the multidrop cable 200 running through a wireway 570 and include various pieces of equipment 502, 504, 506, 508, 510 connected to one another via multidrop trunkline cable 200 and the branchline cable 201 within the buckets 118, 120, 122, 124. As previously described, if the operator of the MCC 100 wishes to insert or remove a bucket, or add more nodes to the subnet, without disturbing the subnet, the operator may utilize the disclosed multidrop make and break device 600. In the embodiment shown in FIG. 7, buckets 120 and 124 include multidrop branchline cables 201 forming a single line communication path within the buckets 120, 124 that connect pieces of equipment 504, 506, 508, 510. The equipment 502, 504, 506, 508, and 510 may include, for example, motor controllers, VFDs, PLCs, PACs, contactors, starters, overload protection components, fuses, circuit breakers, disconnects, short circuit protectors, interfaces, indicators, buttons, switches, displays, sensors, and so forth. Though the MCC withdrawable units 402 installed in buckets 120 and 124 shown in FIG. 7 include four nodes 504, 506, 508, and 520, it should be understood that the MCC withdrawable units 402 installed in buckets 118, 120, 122, 124 of the MCC 100 may include any numbers of nodes. For example, embodiments are envisaged in which the MCC withdrawable units 402 include 2, 3, 4, 5, 6, 7, 8, 9, 10, or more nodes.

The multidrop make and break devices 600 form a first subnet through the trunkline cable 200 and one or more second subnets through the branchline cables 201. The trunkline 200 enables communication between the buckets 118, 120, 122, and 124. The branchline 201 enables communication between the nodes (e.g., nodes 504, 506, 408, and 510) within each bucket. When the branchline 201 is added to or removed from the multidrop make and break devices 600, the subnet communication over the trunkline 200 is not disrupted.

Figure 8:
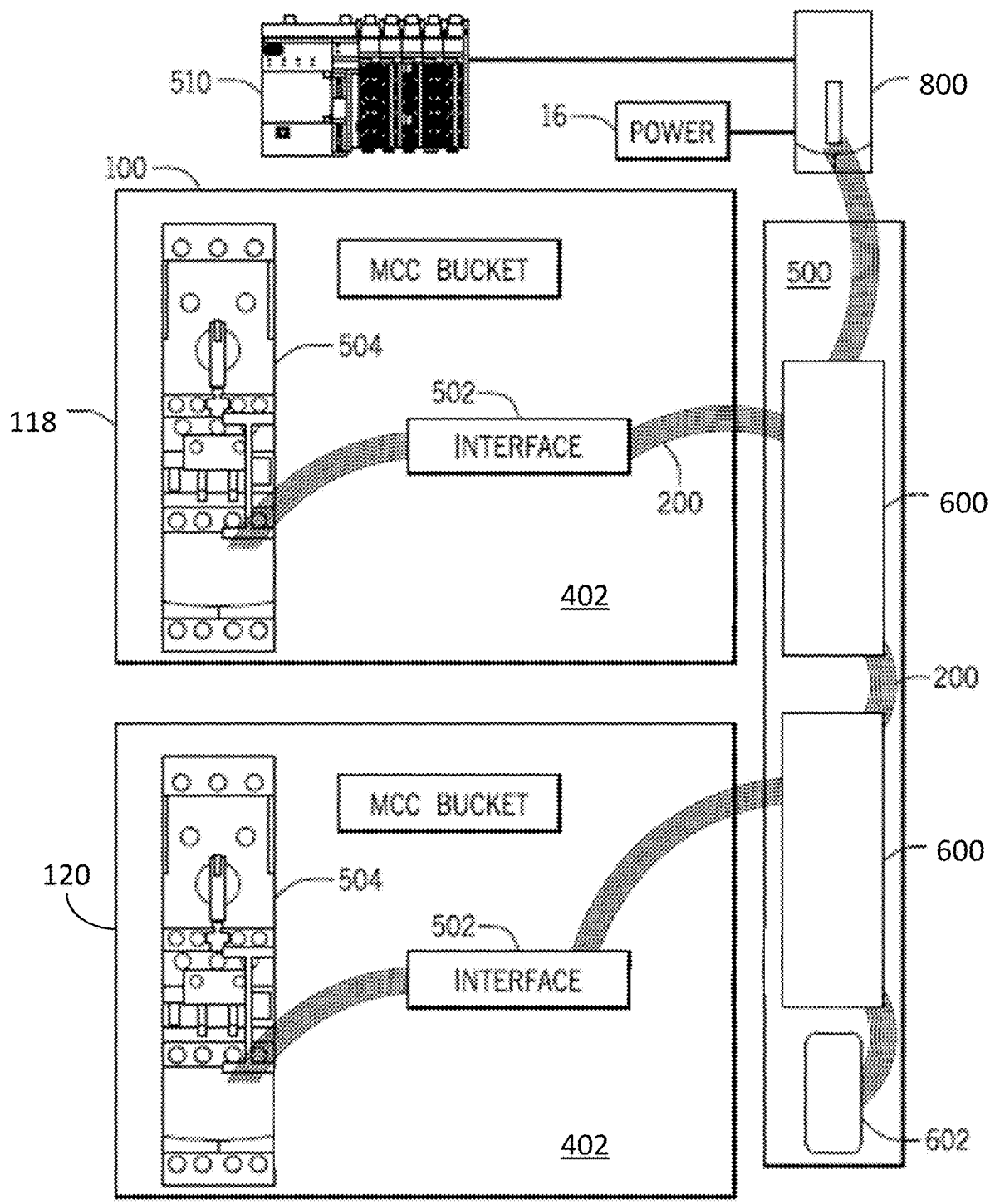
FIG. 8 is a schematic view of the MCC having two buckets connected to the multidrop cable via the multidrop make and break devices, in accordance with embodiments presented herein.

FIG. 8 illustrates a schematic view of an MCC 100 having two MCC withdrawable units 402 installed in two respective buckets 118, 120 that are connected to the multidrop cable 200 via multidrop make and break devices 600. As shown, power from a power source 16 and a control signal generated by a PLC 510 is provided to a gateway 800. The multidrop cable 200 extends from the gateway 800 through the wireway 500 to a terminator 602. A first multidrop make and break device 600 couples an MCC withdrawable unit 402 installed in a first bucket 118, and including an interface 502, and a piece of equipment 504. The interface 502 may include, for example, push buttons, knobs, switches, indicator lights, gauges, displays, touch screens, etc. The equipment 504 in the first bucket 118 may include, for example, motor controllers, VFDs, PLCs, PACs, contactors, starters, overload protection components, fuses, circuit breakers, disconnects, short circuit protectors, interfaces, indicators, buttons, switches, displays, sensors, and so forth.

Similarly, a second multidrop make and break device 600 may be coupled a second MCC withdrawable unit 402 installed in a second bucket 120, and including an interface 502, and a piece of equipment 504. As with the MCC withdrawable unit 402 installed in the first bucket 118, the interface 502 may include, push buttons, knobs, switches, indicator lights, gauges, displays, touch screens, etc. However, the interface 502 of the MCC withdrawable unit 402 installed in the second bucket 120 may or may not be the same as the interface 502 MCC withdrawable unit 402 installed in the first bucket 118. As with the first bucket 118, the equipment 504 in the MCC withdrawable unit 402 installed in the second bucket 120 may include, for example, motor controllers, VFDs, PLCs, PACs, contactors, starters, overload protection components, fuses, circuit breakers, disconnects, short circuit protectors, interfaces, indicators, buttons, switches, displays, sensors, and so forth. Similarly, the equipment 504 in the MCC withdrawable unit 402 installed in the second bucket 120 may or may not be the same as the equipment 504 that is in the MCC withdrawable unit 402 installed in the first bucket 118. Further, multidrop cables 200 within the different buckets may have different numbers of nodes for different configurations of components. For example, multidrop cable 200 in the first bucket 118 may include four nodes, while a second multidrop cable 200 in the second bucket 120 may include three nodes, based upon what pieces of equipment and how many new nodes an operator wishes to include.

While only certain features of the present disclosure have been illustrated and described herein, many modifications and changes will occur to those skilled in the art. It is, therefore, to be understood that the appended claims are intended to cover all such modifications and changes as fall within the true spirit of the embodiments described herein.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A multidrop system configured to be installed within a motor control center (MCC) of an industrial automation system comprising:
   a trunkline comprising multiple multidrop make and break devices connected through a trunkline cable extending from a first end to a second end, each of the multidrop make and break device comprises:
      a memory;
      processing circuitry, wherein the processing circuitry is communicatively coupled to the memory;
      first physical layer circuitry configured to form a multidrop network comprising multiple MCC units over the trunkline, wherein the first physical layer circuitry is communicatively coupled to the memory and processing circuitry;
      second physical layer circuitry configured to couple an MCC withdrawable unit and form an independent sub-network over a branchline that connects and enables communication with one or more nodes within the MCC withdrawable unit, wherein the multidrop make and break device is configured to couple the MCC withdrawable unit to, and decouple the MCC withdrawable unit from, the second physical layer circuitry without disrupting the multidrop network, wherein the second physical layer circuitry is communicatively coupled to the memory, processing circuitry, and first physical layer circuitry;
      a sensor configured to detect a voltage, a current, or both, within the industrial automation system, wherein the sensor is communicatively coupled to the second physical layer circuitry;
      a first terminal configured to communicatively couple to the first end of the trunkline;
      a second terminal configured to communicatively couple to the second end of the trunkline; and
      a third terminal, configured to communicatively couple to the MCC withdrawable unit.

2. The multidrop system of claim 1, wherein the trunkline and the branchline comprise a cable comprising:
   a single pair Ethernet (SPE) pair;
   a network power (NP) pair configured to provide power to one or more network components in a device;
   a switched power (SP) pair configured to provide supplemental power to one or more actuation components in the device; and
   a select line.

3. The multidrop system of claim 1, wherein the first and second terminals are configured to connect to the first physical layer circuitry.

4. The multidrop system of claim 3, wherein the third terminal is configured to connect to the second physical layer circuitry.

5. The multidrop system of claim 1, wherein the MCC withdrawable unit comprises one or more motor controllers, one or more variable frequency drives (VFDs), one or more programmable logic controllers (PLCs), one or more programmable automation controllers (PACs), one or more contactors, one or more motor starters, one or more overload protection components, one or more fuses, one or more circuit breakers, one or more disconnect switches, one or more short circuit protectors, or a combination thereof.

6. The multidrop system of claim 1, wherein the MCC withdrawable unit comprises one or more push buttons, one or more knobs, one or more switches, one or more indicator lights, one or more gauges, one or more displays, one or more touch screens, or a combination thereof.

7. The multidrop system of claim 1, wherein each of the multidrop make and break devices has a T-shape.

8. The multidrop system of claim 1, wherein the memory stores firmware instructions configured to be executed by the processing circuitry.

9. An apparatus for providing a trunk network and one or more branch sub-networks within a motor control center (MCC) of an industrial automation system comprising:
   a memory;
   processing circuitry, wherein the processing circuitry is communicatively coupled to the memory;
   first physical layer circuitry configured to form the trunk network over a trunkline, wherein the trunkline comprises a trunkline cable extending from a first end to a second end, wherein the first physical layer circuitry is communicatively coupled to the memory and processing circuitry;
   second physical layer circuitry configured to:
      couple an MCC withdrawable unit and form a branch subnet over a branchline that connects and enables communication with one or more nodes within the MCC withdrawable unit;
      decouple the MCC withdrawable unit from the branch sub-network without disrupting the trunk network wherein the second physical layer circuitry is communicatively coupled to the memory, processing circuitry, and first physical layer circuitry;
   a sensor configured to detect a voltage, a current, or both, within the industrial automation system, wherein the sensor is coupled to the second physical layer circuitry;
   a first terminal configured to communicatively couple to the first end of the trunkline;
   a second terminal configured to communicatively couple to the second end of the trunkline; and
   a third terminal configured to connect to the MCC withdrawable unit.

10. The apparatus of claim 9, wherein the trunkline cable comprises:
    a single pair Ethernet (SPE) pair;
    a switched power (SP) pair;
    a network power (NP) pair; and
    a select line.

11. The apparatus of claim 9, wherein the apparatus has a T-shape.

12. The apparatus of claim 9, wherein the memory stores firmware instructions configured to be executed by the processing circuitry.

13. The apparatus of claim 9, wherein the first and second terminals are configured to connect to the first physical layer circuitry.

14. The apparatus of claim 13, wherein the third terminal is configured to connect to the second physical layer circuitry.

15. A system, comprising:
    a motor control center (MCC);

a multidrop system, comprising:
a trunkline comprising multiple multidrop make and break devices connected through a trunkline cable extending from a first end to a second end, wherein each of the multidrop make and break device comprises:
a memory;
processing circuitry, wherein the processing circuitry is communicatively coupled to the memory;
first physical layer circuitry configured to form a multidrop network comprising multiple MCC units over the trunkline, wherein the first physical layer circuitry is communicatively coupled to the memory and processing circuitry;
second physical layer circuitry configured to couple an MCC withdrawable unit installed in a bucket of the MCC and form an independent sub-network over a branchline that connects and enables communication with one or more nodes within the MCC withdrawable unit, wherein the multidrop make and break device is configured to couple the MCC withdrawable unit to, and decouple the MCC withdrawable unit from, the second physical layer circuitry without disrupting the sub-network, wherein the second physical layer circuitry is communicatively coupled to the memory, processing circuitry, and first physical layer circuitry;
a sensor configured to detect a voltage, a current, or both, within the multidrop system, wherein the sensor is communicatively coupled to the second physical layer circuitry;
a first terminal configured to communicatively couple to the first end of the trunkline;
a second terminal configured to communicatively couple to the second end of the trunkline; and
a third terminal configured to communicatively couple to the MCC withdrawable unit.

16. The system of claim 15, wherein the trunkline cable comprises:
a single pair Ethernet (SPE) pair;
a switched power (SP) pair;
a network power (NP) pair; and
a select line.

17. The system of claim 15, wherein the first and second terminals are configured to connect to the first physical layer circuitry.

18. The system of claim 17, wherein the third terminal is configured to connect to the second physical layer circuitry.

19. The system of claim 15, wherein the multidrop make and break device has a T-shape.

20. The system of claim 15, wherein the memory stores firmware instructions configured to be executed by the processing circuitry.

* * * * *